United States Patent [19]
Dehaine et al.

[11] Patent Number: 6,059,624
[45] Date of Patent: May 9, 2000

[54] SCREEN AND DRIVER ASSEMBLY FOR SCREEN PIXELS

[75] Inventors: Gérard Dehaine, Châtillon; Thierry Fromont, Massy, both of France

[73] Assignee: Bull S.A., Louveciennes, France

[21] Appl. No.: 09/147,308

[22] PCT Filed: Mar. 24, 1998

[86] PCT No.: PCT/FR98/00586

§ 371 Date: Nov. 25, 1998

§ 102(e) Date: Nov. 25, 1998

[87] PCT Pub. No.: WO98/44478

PCT Pub. Date: Oct. 8, 1998

[30] Foreign Application Priority Data

Mar. 27, 1997 [FR] France .................................. 97 03779

[51] Int. Cl.⁷ .................................................. G02F 1/1345
[52] U.S. Cl. ........................... 445/24; 349/150; 257/786; 228/104; 228/180.22; 438/15
[58] Field of Search .............................. 315/169.3, 169.4; 349/150, 152; 228/104, 103, 180.22, 214; 257/786; 445/24; 438/15

[56] References Cited

U.S. PATENT DOCUMENTS

| | | | |
|---|---|---|---|
| 4,604,644 | 8/1986 | Beckham et al. | 228/214 |
| 5,157,476 | 10/1992 | Yoshida | 257/786 |
| 5,311,341 | 5/1994 | Hirai | 349/150 |
| 5,367,763 | 11/1994 | Lam | 438/15 |
| 5,402,255 | 3/1995 | Nakanishi et al. | 349/150 |
| 5,925,931 | 7/1999 | Yamamoto | 257/786 |

FOREIGN PATENT DOCUMENTS

| | | |
|---|---|---|
| 0 567 209 | 10/1993 | European Pat. Off. . |
| 0 588 481 A1 | 3/1994 | European Pat. Off. . |

OTHER PUBLICATIONS

Sumitomo Takeda et al., "Fine Pitch Tab Technology With Straight Side Wall Bump Structure for LCD/Panel", IEEE Transactions on Consumer Electronics vol. 35, No. 3, Oct. 1989, pp. 343–350.

Primary Examiner—Kenneth J. Ramsey
Attorney, Agent, or Firm—Edward J. Kondracki; Kerkam, Stowell, Kondracki & Clarke, P.C.

[57] ABSTRACT

The display screen (11) is made of pixels (P) connected to one edge (11a) of the screen by wires (12) separated by a given pitch (s) so as to be controlled by respective terminals (18) of integrated circuits (16) outside the screen. The terminals (18) of each integrated circuit are disposed in a plurality of parallel rows (19) in which they are separated from one another by a pitch (Sm) equal to several times the pitch of the wires. Each integrated circuit is mounted on a connecting support (10) formed by an insulating film (21) carrying conductive tracks (23) connecting the terminals of the integrated circuit to the corresponding wires of the screen, the tracks extending substantially at the pitch of the wires. The mounting is done simply by collective reflow of bumps between the tracks (23) and the terminals (18), and the support (10) makes it possible to test the integrated circuits before they are mounted on the screen.

5 Claims, 4 Drawing Sheets

FIG_1

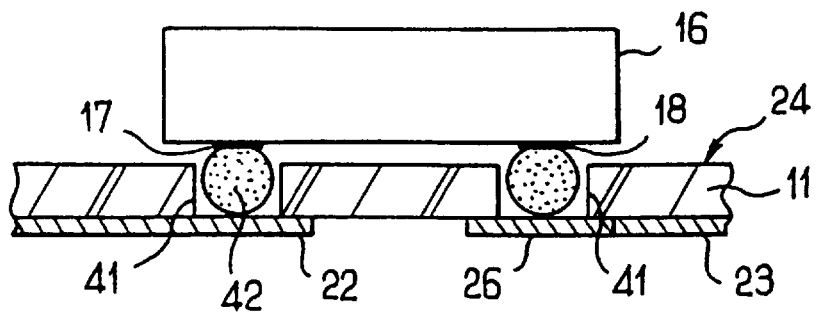
FIG_4
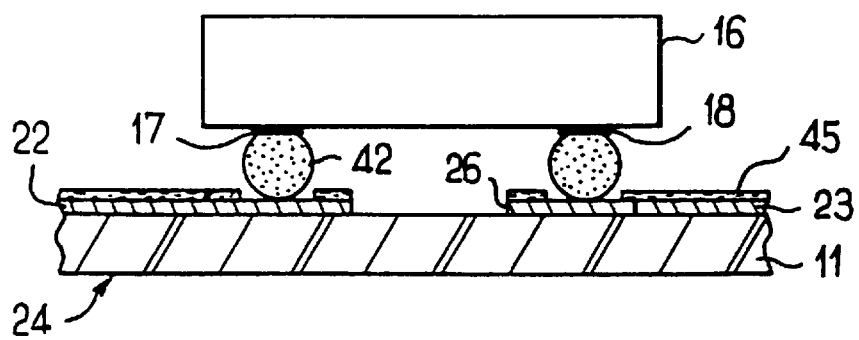
FIG_5
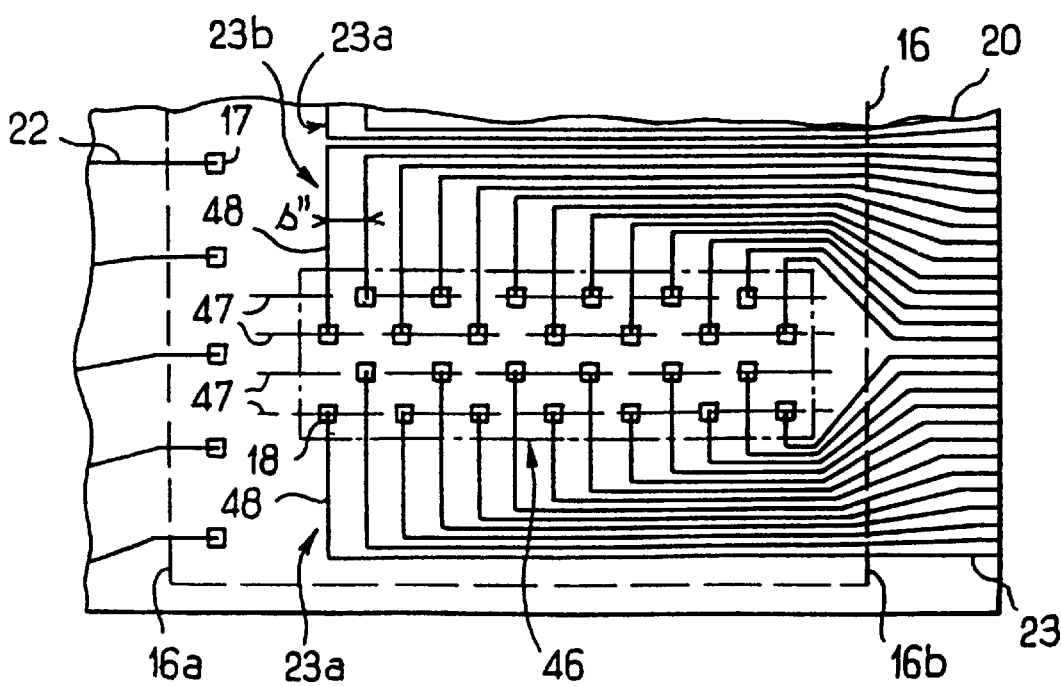
FIG_6

SCREEN AND DRIVER ASSEMBLY FOR SCREEN PIXELS

BACKGROUND OF THE INVENTION

1. Field of the Invention

The present invention relates to a display screen equipped with control circuits for the screen pixels. More specifically, it relates to a liquid crystal display or LCD screens, to electroluminescent screens, to plasma screens, and to micropoint screens, also known as "field emission display" screens. Even more specifically, the invention relates to a process and an installation for assembling the control circuits for their subsequent connection to the screen.

2. Description of Related Art

A pixel screen is formed by a matrix of pixels controlled by means of a grid of perpendicular wires called a control grid. A screen of this type is also called a flat panel screen, as opposed to a curved screen in which the pixels are exited by a beam scanning the screen, such as a television screen.

Screen pixels are ordinarily controlled by a display card located outside the screen. The card is connected to the control grid by control circuits (drivers) formed by integrated circuits and ordinarily disposed on the rear periphery of the screen. The input-output terminals of the integrated circuits are connected to respective wires of the grid. Because of the large number of wires in the grid, some integrated circuits are disposed side by side along one edge of the rear side of the screen for the connection of the horizontal wires, and other integrated circuits are disposed in the same way on an adjacent edge for the connection of the vertical wires. The integrated circuits have input terminals which receive signals from the display card and output terminals connected to corresponding wires of the screen. The integrated circuits determine and control, based on signals they receive from the card, the state of the corresponding wires of the grid in order to control the associated pixels. In order for the space occupied by the integrated circuits on an edge to be minimal, their output terminals must have substantially the same pitch as the wires. Moreover, the integrated circuits must be separated from one another so as to be electrically insulated. In order to compensate for the space required for their insulation, it is necessary for the output terminals of the integrated circuits to be at a pitch smaller than the pitch of the screen wires.

The continually increasing miniaturization of pixels makes it possible to increase their density and to improve the quality of the image. At the present time, the pitch of grid wires can fall below 100 $\mu$m, for example between 70 and 90 $\mu$m. The pitch of the output terminals of the integrated circuits must be even smaller than the pitch of the wires. The problem under these conditions is to connect the grid wires to the output terminals of the integrated circuits by means of a process that provides good connection reliability, a practically null failure rate, and mass production at low cost.

One solution consists of alternating the side from which the wires of the grid are excited. Thus, one of every two wires is connected to an integrated circuit placed on one side of the screen, the other wire of each pair being connected to an integrated circuit placed on the opposite side. This makes it possible to divide the connection density in half. However, the edges of the screen must also carry other accessories, so at best, only one additional side can be occupied by the integrated circuits. Hence, the problem remains on one side.

Conceivable solutions to the problem include those for connecting the output terminals of an integrated circuit to the connection pads of the corresponding wires of the grid. The wire connection, according to the technology better known as "wire bonding," consists of soldering the end of a connecting wire to a pad, then to the corresponding output terminal, and of cutting the wire. Given the large number of connections of this type, this technology takes too long. A process adapted to low-cost mass production must make it possible to connect a group of output terminals to a corresponding group of pads (gang bonding).

From this point of view, a first conceivable solution consists of directly connecting the terminals of the integrated circuit to the connection pads of the grid wires. This arrangement places the integrated circuit in a position inverse to the one used ordinarily and is therefore called an inverted assembly, or "flip chip" assembly. The connection can be made by soldering or bonding by means of an electrically conductive adhesive. The extremely small pitch of the output terminals already poses a difficult problem in making this connection. But the major drawback of this solution is that it does not allow complete testing of the assembly of each integrated circuit, and consequently the screen is rejected if an integrated circuit is found to be defective. This is unacceptable.

A second conceivable solution is to mount the integrated circuit on a support according to the technology better known as TAB (Tape Automated Bonding). The support is ordinarily made of a flexible organic material provided with a central opening for housing an integrated circuit. One side of the support carries a group of leads having inner ends that extend into the opening and are disposed in correspondence with the respective terminals of an integrated circuit in order to be soldered to them. The soldering is an operation, commonly called an ILB (Inner Lead Bonding) operation, that can be carried out simultaneously on all or some of the terminals of the integrated circuit, either by means of balls (bumps) placed on the regions, or without balls (bumpless). The outer ends of the corresponding leads are then connected to the pads of the grid wires, by an anisotropic adhesive, for example. The conductors must therefore extend along the support at substantially the same pitch as the wires and have inner ends with a pitch smaller than that of the wires. At such a small pitch, the ILB operation poses a major problem. A grouped soldering of all the output terminals to the ends of the leads becomes impossible or can no longer be considered reliable.

SUMMARY OF THE INVENTION

It is an object of the invention to connect pixel-driving integrated circuits to a screen in accordance with an industrial process that allows mass production at low cost.

Another object is to allow a grouped connection of all the output terminals of each integrated circuit.

Another object is to make it possible to easily and inexpensively test the assembly of the integrated circuits before and/or after their connection to the screen.

Another object is to make it possible to easily and inexpensively replace an integrated circuit connected to a screen.

One form of the invention is a display screen having pixels connected to one edge of the screen by wires separated by a given pitch so as to be controlled by respective terminals of integrated circuits outside the screen, characterized in that the terminals of each integrated circuit are disposed in a plurality of parallel rows in which they are separated from one another by several times the pitch of the wires, and in that each integrated circuit is mounted on a connecting support formed by an insulating film carrying conductive tracks connecting the terminals of the integrated circuit to the corresponding wires of the screen, the tracks extending substantially at the pitch of the wires.

Another form of the invention is a unit that includes such a screen, this unit being for example a laptop computer.

The invention also is a process for connecting integrated circuits to a display screen having pixels connected to one edge of the screen by wires separated by a given pitch so as to be controlled by respective terminals of the integrated circuits, characterized in that it is comprised of using integrated circuits wherein said terminals are disposed in a plurality of parallel rows in which they are separated from one another by several times the pitch of the wires, of forming a connecting support comprising an insulating film carrying conductive tracks whose inner ends have the disposition of said terminals of the integrated circuits and extend substantially at the pitch of the wires, the tracks ending in test ends, of mounting each integrated circuit on the support by means of a collective bonding of the integrated circuit terminals to the inner ends of the respective tracks, of testing the assembly by means of the test ends and selecting the integrated circuits whose tested operation is good, and of connecting the support of a selected integrated circuit to the corresponding wires of the screen.

Another form of the invention is a manufacturing process or assembly line for mounting integrated circuits on a connecting support for the implementation of the process, the connecting support being intended for connecting the integrated circuits to a display screen having pixels connected to one edge of the screen by wires separated by a given pitch so as to be controlled by respective terminals of the integrated circuits, characterized in that it comprises means for supplying integrated circuits having terminals disposed in a plurality of parallel rows in which they are separated from one another by several times the pitch of the wires, means forming a connecting support comprising an insulating film carrying conductive tracks whose inner ends have the disposition of the terminals of the integrated circuits and extend substantially at the pitch of the wires, the tracks ending in test ends, a station for mounting each integrated circuit on the support, the mounting station carrying out a collective bonding of the terminals of the integrated circuits to the inner ends of the respective tracks, a device for testing the assembly by means of the test ends and for selecting the integrated circuits whose tested operation is good, and a control unit for running the installation.

The characteristics and advantages of the invention emerge from the following description, given as an example and made in reference to the appended drawings.

BRIEF DESCRIPTION OF THE DRAWINGS

FIG. 4 is a view in schematic partial cross-section, made along the line IV—IV indicated in FIG. 2, of an exemplary assembly for obtaining the connecting structure represented in FIG. 1 using the tape illustrated in FIG. 2 and the installation represented in FIG. 3;

FIG. 5 is a view similar to that in FIG. 4 and illustrates a variant of assembly;

FIG. 6 is a view similar to that in FIG. 1 and illustrates a variant of the connecting structure according to the invention and of its assembly.

DETAILED DESCRIPTION OF THE PREFERRED EMBODIMENTS

To begin with, it is noted that the examples described are represented by very schematic views and do not conform to the actual normal and relative dimensions of the structures represented. The purpose of the appended figures is to suggest the actual structure to one skilled in the art while clearly emphasizing the characteristics of the invention.

Figure 1:
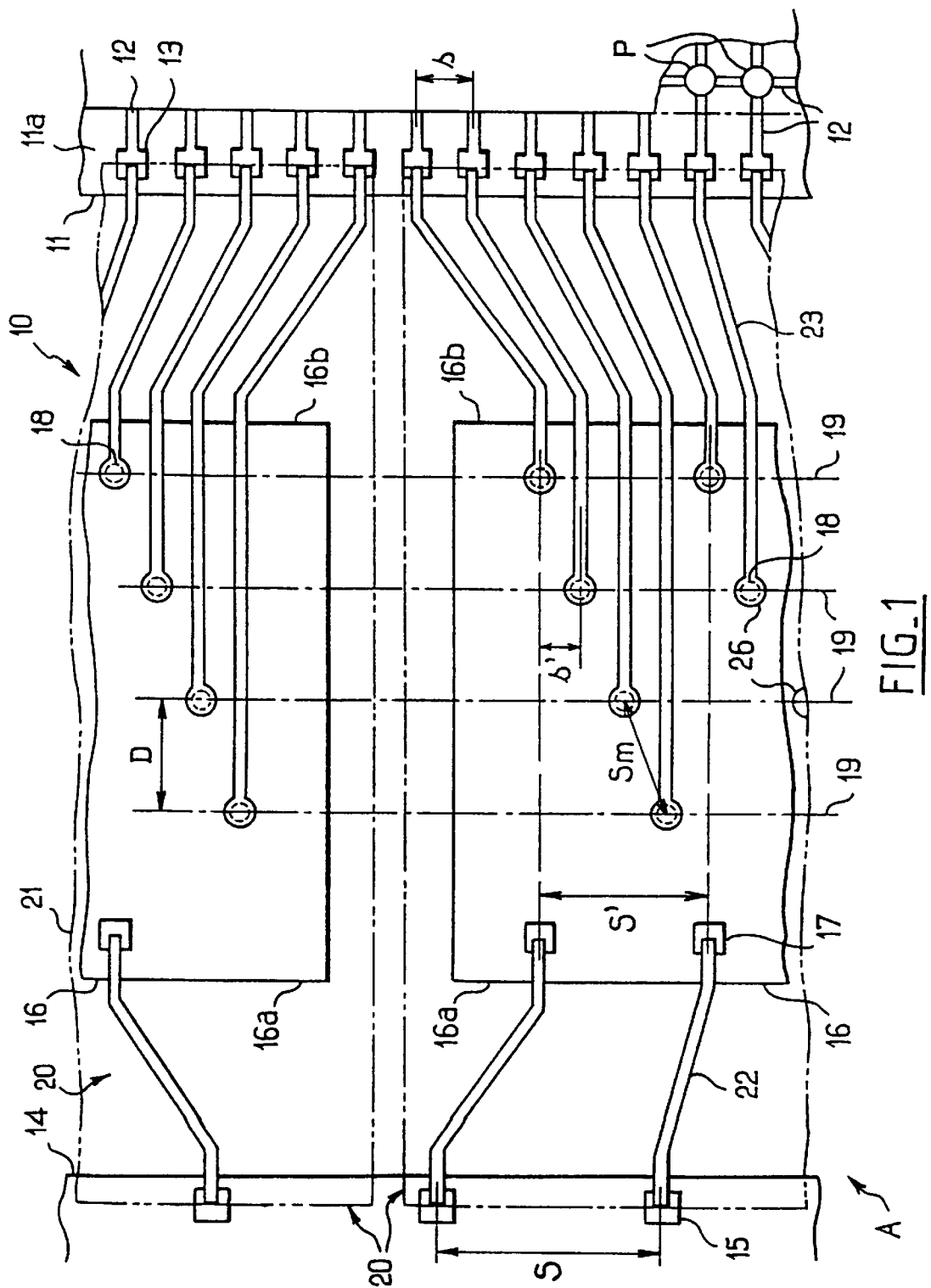
FIG. 1 is a schematic plan view of a structure for connecting to a display screen according to the invention.

FIG. 1 is a partial top view of a structure 10 for connecting to a display screen 11 intended for a unit A, in this case a laptop computer. As indicated in a partial cutaway at the bottom of the screen illustrated, the pixels P of the screen cover the entire surface of the screen, except for a peripheral margin 11a along at least two adjacent sides of the screen. Each pixel P is controlled by two perpendicular wires 12. The assembly of the wires 12 forms a grid, partially represented. The wires 12 running in each direction are disposed at a pitch s, for example s=90 $\mu$m. Each wire 12 has in the peripheral margin 11a an end equipped with a connection pad 13. The electrical state of each wire 12 is controlled by a display card 14, a printed circuit board for example, which is represented partially in FIG. 1 so that only the edge near the screen is shown. This edge is equipped with terminals 15 separated by a pitch S that is relatively large compared to the pitch s of the wires 12, such that S=400 $\mu$m. The connection between the display card 14 and the screen 11 is made by means of at least one integrated circuit 16 for controlling the screen, two circuits 16 in the part represented in FIG. 1.

Each control circuit 16 has terminals 17 for connecting to respective terminals 15 of the display card 14, and terminals 18 for connecting to the respective pads 13 of the screen wires 12. The terminals 17 illustrated in FIG. 1 are disposed on the circuit 16 near the edge 16a placed facing the display card 14 and are aligned in a line parallel to the edge 16a at a pitch S' slightly smaller than the pitch S of the terminals 15, such that S'=355 $\mu$m in the example in question. The terminals 18 illustrated are disposed near the opposite edge 16b facing the screen 11 and are aligned in four rows 19, parallel to the edge 16b and represented by a dot-and-dash line. The terminals 18 are separated from one another, in lines perpendicular to the edge 16b, by a pitch s' slightly smaller than the pitch of the pads 13, such that s'=70 $\mu$m. The pitches s' and S' are respectively smaller than the respective pitches s and S of the terminals 13 and 15 so that the circuits 16 can be placed side by side yet retain the pitch of the pads 13 and/or the terminals 15, as illustrated. The four rows 19 are separated by a distance D calculated so that two adjacent terminals 18 of two adjacent rows 19 are separated by at least a minimal pitch Sm, which will be defined below, and which is considered equal to about 254 $\mu$m. Under these conditions, the distance D=244 $\mu$m.

The structure 10 also includes at least one support 20 used for the connection to the display card 14. Each support 20 illustrated is connected to a respective control circuit and comprises an insulating film 21, one side of which carries a group of conductive tracks 22 for connecting the terminals 15 and 17 to one another and a group of tracks 23 for connecting the terminals 18 to the respective pads 13. In FIG. 1, the two supports 20 cover the two control circuits 16. However, in order to facilitate the reading of this figure, the edges of each film 21 are represented by a broken line, and should be considered to be non-existent or invisible.

Figure 2:
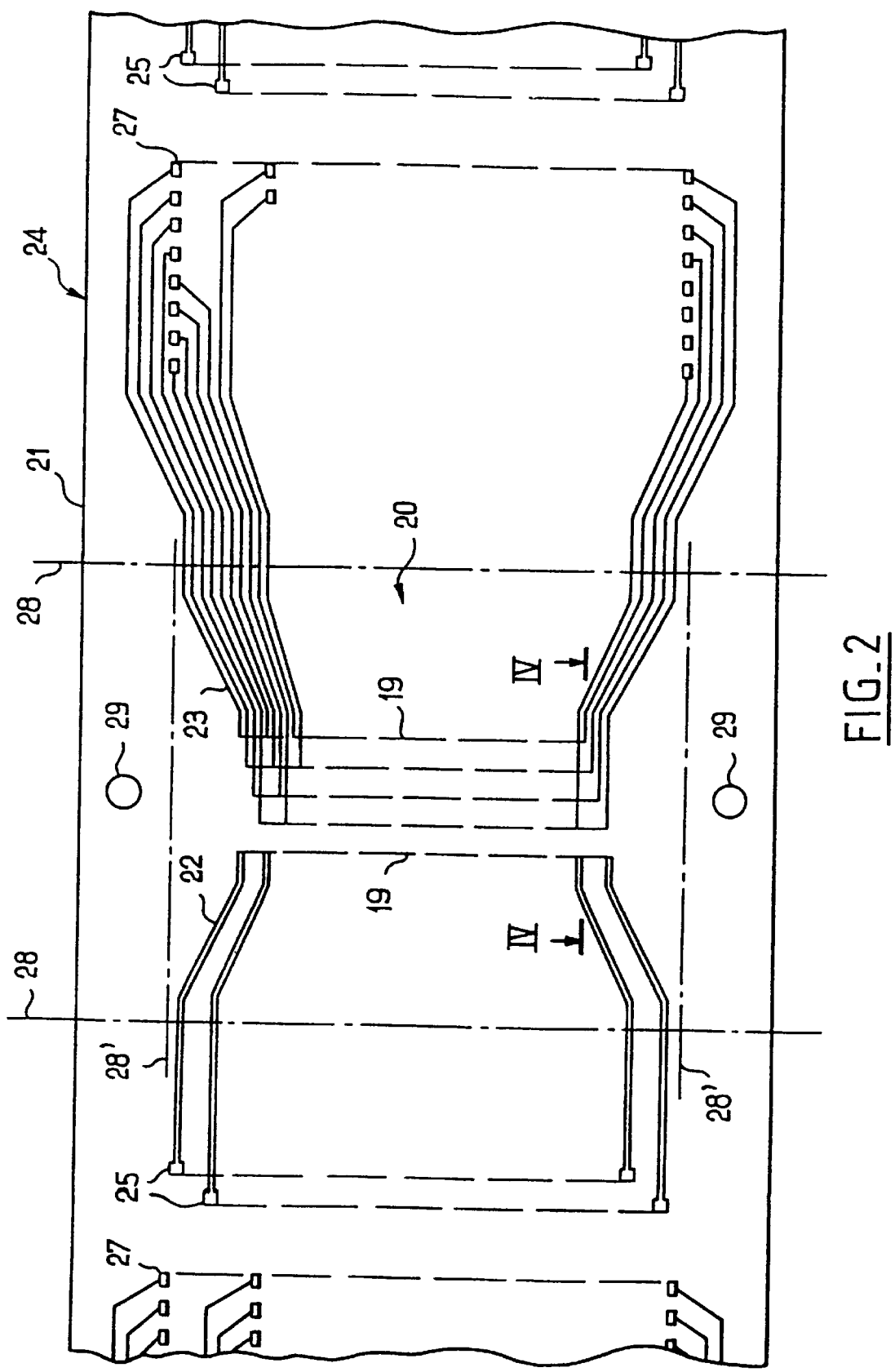
FIG. 2 is a partial top view of a tape used for the production of the connecting structure represented in FIG. 1.

FIG. 2 is a partial top view of a tape 24 used for the formation of the supports 20 represented in FIG. 1. The tape 24 illustrated is the TAB type and carries a longitudinal succession of connection assemblies, including each of the tracks 22 and 23 and each support 20 represented in FIG. 1. The tracks 22 illustrated in FIG. 2, and more precisely in FIG. 1, have a width on the order of 100 μm and have inner ends aligned at the pitch S' of 355 μm which diverge to form parallel straight parts at the pitch S=400 μm of the terminals 15. As indicated in FIG. 2, the straight parts extend beyond the position provided for the terminals 15 of the card 14 and end in respective test regions 25. On the other hand, the tracks 23 illustrated in FIG. 2, and more precisely in FIG. 1, have inner ends with a width on the order of 35 μm at a pitch s'=70 μm. From FIG. 2, it is clear that they end in wider regions 26, in this case disks having a diameter of 90 μm, in positions corresponding to the terminals 18 of a circuit 16. The tracks 23 then diverge to form parallel straight parts at the pitch s=90 μm of the pads 13, then diverge again further on so as to have outer parts equipped with test regions 27 corresponding to the normal pitch of the probes of a testing tool.

Each support 20 is formed by cutting the tape along transverse cutting lines 28 in the straight parts of the tracks 22 and 23 having the respective pitches S and s. Consequently, the tape 24 is a longitudinal extension of the film 21 of the supports 20 in FIG. 1. It can also include lateral extensions, as illustrated, equipped with holes 29 serving as references for positioning the band for production and testing. The lateral extensions can also be removed by cutting along lines 28', as was done to obtain the supports 20 illustrated in FIG. 1.

Figure 3:
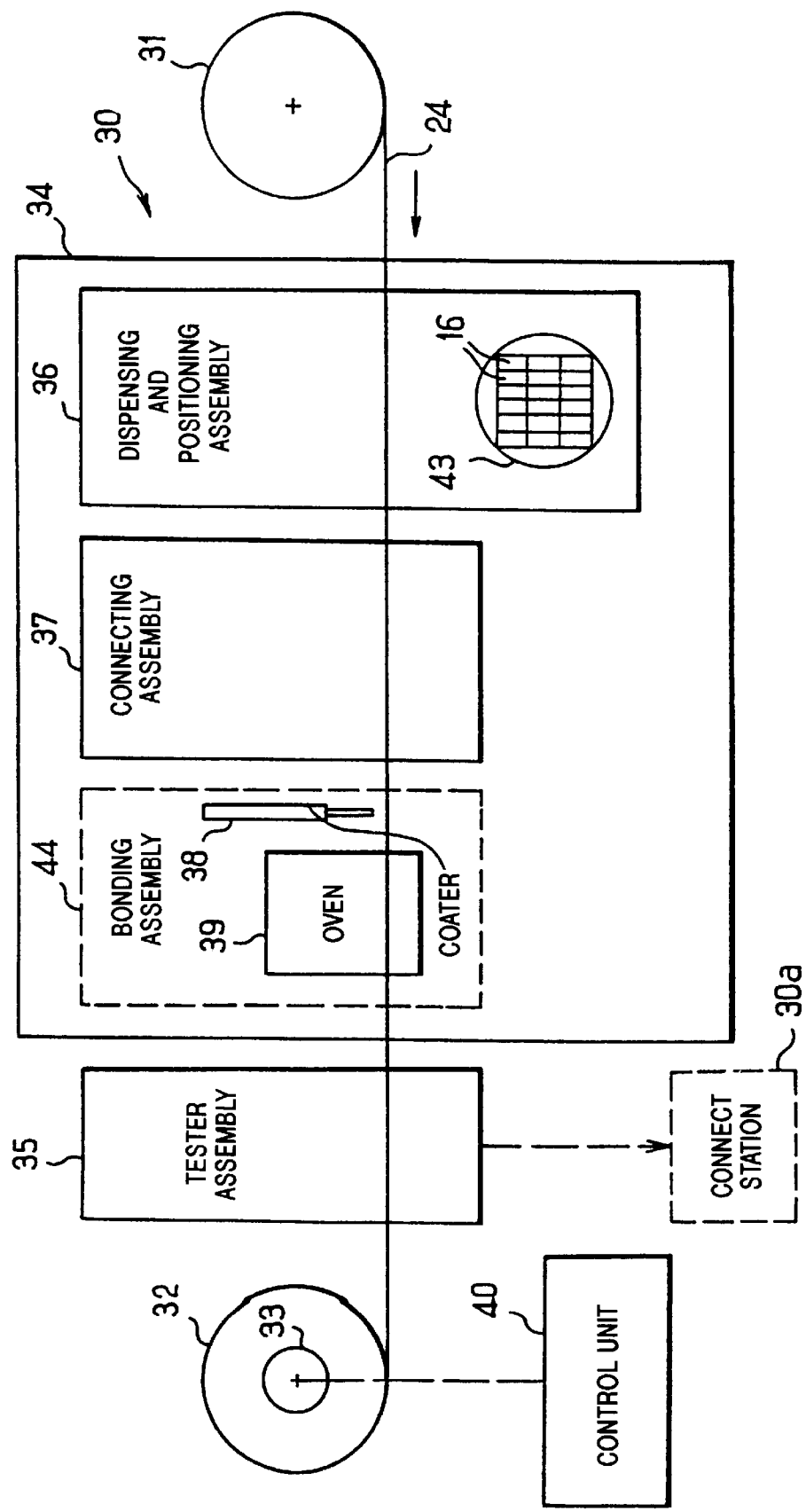
FIG. 3 is a synoptic view of an installation for the production of a connecting structure according to the invention.

FIG. 3 illustrates a manufacturing process 30 for assembling circuits 16 for the formation of the connecting structure 10 represented in FIG. 1. An assembly station 30 illustrated is part of an assembly line using the continuous tape 24 illustrated in FIG. 2 as a carrier support for the integrated circuits 16 dispensed from store 36 in a well known manner. The assembly line begins with a start reel 31 from which the tape 24 represented in FIG. 2 is unrolled and ends in an end reel 32 driven by a motor 33 for unwinding the tape 24 from the reel 31. The manufacturing assembly process 30 comprises an assembly station 34 for mounting the circuits 16 onto the tape 24 and a testing device 35 for testing circuits mounted on the tape. The station 34 illustrated successively comprises, in the direction in which the tape 24 is unwound from the reel 31, a dispensing and positioning device 36 for positioning the circuits 16 on the tape 24, a device 37 for connecting the circuits 16 to the tape 24, a coating tool 38 and a firing oven 39. The testing device 35 is located after the station 34. The motor 33 for driving the reel 32 is operated by a control unit 40 so as to move the tape 24 in accordance with a series of steps that will now be described.

FIG. 4 is a view in partial cross-section, made along the line IV—IV indicated in FIG. 2, of the tape 24 represented in FIG. 2 at the level of the positioning device 36 in FIG. 3. As is clear in FIG. 4, the tape 24 seen in FIG. 2 is turned over in order to be placed on the reels 31 and 32 so that the tracks 22 and 23 are located on the bottom side of the tape. The positioning device 36 illustrated assumes that the connection of a circuit 16 to the tape 24 takes place through holes 41 in the film 21 of the tape 24 by means of bumps 42. The holes 41 are closed by the disks 26 constituting the inner ends of the tracks 23.

In the positioning device 36 illustrated, the circuits 16 are available on a semi-conductive wafer 43 on which they have been produced. The circuits 16, like the one illustrated in FIG. 4, have their terminals 17 and 18 equipped with respective bumps 42. The actual bumps usually have a diameter of about 600 to 700 μm and are ordinarily made of solder, such as a mixture of tin and lead. The large diameter of the bumps and their deformation when they are bonded require that the terminals have to be separated by a minimal distance, which determines the minimal pitch Sm of the terminals 18.

The positioning device 36 successively removes the circuits 16 from the wafer 43 and positions them on the tape 24 so that the bumps 42 fit into the holes 41, resting on the ends of the respective tracks 22 and 23. Each circuit 16 thus has its active side placed facing the tape 24 in accordance with an assembly called a "flip chip" assembly. The circuit 16 thus positioned moves into the connecting device 37, where the bumps 42 are heated and reflow so as to bond and electrically connect the circuit 16 to the tape. At the output of the connecting device 37, each circuit 16 receives from the coating tool 38 a coating material for mechanically and chemically protecting the circuit 16 and improving its bond to the tape. The coating material then undergoes a firing in the oven 39. The coating tool 38 and the oven 39 thus constitute means 44 for bonding and/or protecting the circuits on the band. The means 44 are optional, as indicated by a broken line. Finally, each circuit 16 passes into a testing device 35 to undergo a functional test, and preferably, a marking is carried out to make it possible to separate the good circuits 16 from the bad ones. The test can be done after the winding of the tape onto the reel 32. Then it is simply necessary to unwind the tape 24 from the reel 32 in order to cut out the supports 20, as indicated in FIG. 2 by the cutting lines 28 and 28'.

According to another variant indicated by a broken line in FIG. 3, the manufacturing process 30 includes a second station 30a as a part of the assembly line for connecting the supports 20 to respective screens. The outer ends of the tracks 23 are bonded to the respective pads 13, for example by means of an anisotropic contact film. A film of this type is electrically insulating in its normal state and becomes conductive in the places where it is subjected to a given pressure, in this case between the pads and the ends of the respective tracks. According to this variant, another test is carried out, with or without the testing device 35, in order to verify whether the connection of the pads to the tracks is satisfactory. If a defect is detected, it is sufficient, for example, to replace the film and/or the support in question. This can be done without damaging the screen.

FIG. 5 is a view similar to that in FIG. 4 and illustrates a variant of the mounting of a circuit 16 onto the tape 24. In this case, the tape 24 is placed between the reels 31 and 32 in such a way that the tracks 22 and 23 are on the top side of the tape, as indicated in FIG. 2. Moreover, instead of the holes 41 in the film 21 of the tape 24, a layer 45 of solder resistant material is deposited on the tracks 22 and 23, except at their inner ends to which the bumps 42 must be bonded. In the connecting device 37, the layer 45 limits the flow of solder from the balls melting on the uncovered ends of the layer. The layer 45 can be deposited by serigraphy.

FIG. 6 is a view similar to that in FIG. 1 and illustrates a variant of embodiment of the circuit 16 and of the support 20 as well as of the mounting of the circuit 16 onto the support 20. According to this variant, the terminals 18 of the circuit 16 are divided into a plurality of separate groups 46. The circuit 16 of this variant has five groups of twenty six terminals, only one group 46 on one edge of the circuit 16 being represented in its entirety in FIG. 6 by a broken line.

The groups 46 illustrated are approximately rectangular regions whose lengths are perpendicular to the edges 16a and 16b of the circuit 16. In each group 46, the terminals 18 are disposed in four rows 47 parallel to the lengths of the group. Moreover, the terminals 18 in them are disposed quincuncially so that two adjacent terminals 18 of two adjacent rows 47 are separated by the minimal pitch Sm=254 µm.

Moreover, the support 20 illustrated in FIG. 6 is similar to that in FIG. 1, except for the disposition of the tracks 23. The tracks 23 illustrated also extend at a pitch slightly smaller than the pitch of the wires 12 from the pads 13. However, the tracks 23 intended for a group 16 of terminals 18 are divided into two symmetrical bundles 23a, 23b outside the group and disposed on the two respective sides of the group, which are parallel to the rows 47 of terminals 18. The tracks 23 in the two bundles 23a, 23b have parts parallel to the rows 47 of terminals 18. The track parts that are parallel to the rows 47 end in branches 48 perpendicular to the rows 47 disposed in correspondence with respective terminals 18 of two adjacent rows 47 of the group 46. Thus, every other branch of each bundle is in correspondence with a terminal 18 of one given row of the two parallel rows closest to the bundle. If D is the distance between the rows 47, as in FIG. 1, and s" is the pitch of the branches 48, the illustrated configuration of the branches makes it easy to have D=s"=180 µm so as to obtain the minimal pitch Sm=254 µm between the terminals 18.

More generally, it is clear from the examples described above that the subject of the invention is a display screen 11 having pixels P connected by wires 12 to one edge of the screen 11a so as to be controlled by respective terminals 18 of integrated circuits 16 outside the screen. The terminals 18 of each integrated circuit are disposed in a plurality of parallel rows 19, 47, in which they are separated from one another by a distance Sm equal to several times the pitch of the wires 12. Furthermore, each integrated circuit 16 is mounted on a connecting support 10 formed by an insulating film 21 carrying conductive tracks 23 connecting the terminals 18 of the integrated circuit to the corresponding wires 12 of the screen, the tracks extending substantially at the pitch s of the wires 12.

According to the example in FIG. 1, the terminals 18 of each integrated circuit 16 are distributed on the active side of each integrated circuit in one group of several rows, in this case four. In the example in FIG. 6, they are divided into a plurality of groups 46 of at least two parallel rows 47 and the tracks 23 are divided between the groups.

In the example in FIG. 1, the pitch s' of the inner ends of the tracks remains substantially equal to the pitch of the wires, while in FIG. 6, the inner ends form branches separated by an intermediate pitch s" between the pitch Sm of the terminals and the pitch s of the wires. In fact, by comparing the examples of FIGS. 1 and 6, it may be seen that the branches 48 extend along the rows 19.

It has also been seen that another subject of the invention is a process for connecting integrated circuits 16 to a display screen 11 having pixels P connected to one edge 11a of the screen by wires separated by a given pitch s so as to be controlled by respective terminals 18 of the integrated circuits. The process uses integrated circuits wherein these terminals 18 are disposed in a plurality of parallel rows in which they are separated from one another by several times the pitch of the wires. Moreover, a connecting support 10 is formed which comprises an insulating film 21 carrying conductive tracks 23 whose inner ends have the disposition of said terminals of the integrated circuits and extend substantially at the pitch of the wires, the tracks ending in test ends 27. Each integrated circuit is then mounted on the support by a collective bonding of terminals of the integrated circuit to the inner ends of the respective tracks. A collective bonding is applied all at once to a group of or to all of the terminals and tracks. In the example illustrated in FIG. 3, it is advantageously done by means of a solder reflow of bumps 42. The bumps 42 can be pre-bonded to the respective terminals of the integrated circuits 16, as indicated in reference to FIGS. 4 and 5. However, they could also be pre-bonded to the tracks 22 and 23, or positioned on the tracks and simultaneously bonded to the tracks and to the corresponding terminals. According to the process, the assembly is tested by means of the test ends, and the integrated circuits whose tested operation is good are selected, by marking in the example illustrated. A selected integrated circuit support can then be connected to the corresponding wires of the screen. It has been seen that a test of the assembly can also be carried out at this stage of the process and that the invention allows for a simple and non-detrimental repair.

A corollary subject of the invention is a manufacturing process for the mounting of integrated circuits on a connecting support for the implementation of this process. The manufacturing process 30 comprises a mounting or assembly system 34 having means for supplying integrated circuits, constituted in the example of FIG. 3 by the wafer 43, the integrated circuits having terminals disposed in a plurality of parallel rows in which they are separated from one another by several times the pitch of the wires. The process 30 comprises means forming a connecting support, constituted by the tape 24 in the example illustrated in FIG. 2 but which could be in the form of a frame or card carrying a plurality of integrated circuits, or in the form of individual supports. These support means comprise an insulating film 21 (shown in FIG. 2) carrying conductive tracks 23 whose inner ends have the disposition of the terminals of the integrated circuits and extend substantially at the pitch of the wires, the tracks ending in test ends 27. The assembly or mounting station 34 for mounting each integrated circuit onto the support, enables a collective bonding of terminals of the integrated circuit to the inner ends of the respective tracks. The process to be performed also includes a device 35 adjacent station 34 for testing the assembly by means of the test ends 27, the device comprising means for selecting the integrated circuits whose tested operation is good. A control unit 40 makes it possible to run the installation for implementing the process.

In the example described, the mounting station 34 includes a device 36 for positioning the integrated circuits on the means forming the support. Moreover, it includes a connecting device which carries out the solder reflow of bumps disposed between the terminals and the inner ends of the respective tracks. The bumps can be bonded to the tracks 23 or to the terminals 18 prior to the positioning of the integrated circuits or can be positioned on the tracks 23 before the positioning of the integrated circuits.

According to the variants illustrated, the installation comprises means 44 for bonding and/or protecting the integrated circuits on the means forming the support, and a second station for connecting integrated circuits to display screens.

While the preferred forms and embodiments of the invention have been illustrated and described, it will be apparent to those of ordinary skill in the art that various changes and modifications may be made without deviating from the inventive concept and spirit of the invention as set forth above, and it is intended by the appended claims to define all such concepts which come within the full scope and true spirit of the invention.

What is claimed is:

1. A method for connecting integrated circuits (16) to a display screen (11) having pixels (P) connected to one edge (11a) of the screen by wires (12) separated by a given pitch (s) so as to be controlled by respective terminals (18) of the integrated circuits, wherein said terminals are disposed in a plurality of parallel rows (19, 47) in which they are separated from one another by several times (Sm) the pitch of the wires, comprising the steps of forming a connecting support (24) on an insulating film (21) carrying conductive tracks (23) whose inner ends have the disposition of said terminals of the integrated circuits and extend substantially at the pitch of the wires, the tracks ending in test ends (27), mounting each integrated circuit onto the support, collectively bonding terminals of the integrated circuit to inner ends of the respective tracks, testing the assembly by means of the test ends, selecting the integrated circuits whose tested operation is acceptable within a predetermined standard, and connecting the conductive tracks of the support (20) corresponding to a selected integrated circuit to the corresponding wires of the screen.

2. A display screen (11) comprising pixels (P) connected to one edge (11a) of the screen by wires (12) separated by a given pitch (s) so as to be controlled by respective terminals (18) of integrated circuits (16) disposed outside the screen said terminals of each integrated circuit being disposed in at least three parallel rows (19, 47) said terminals being separated from one another by a distance (Sm) which is several times the pitch of the wires, each integrated circuit being mounted on an insulating film support (21) having conductive tracks (23) for connecting terminals of the integrated circuit to corresponding wires of the screen, the tracks extending substantially at the pitch of the wires.

3. The screen according to claim 2, wherein the tracks extending substantially at the pitch of the wires have inner ends (48) connected to the respective terminals of the integrated circuit.

4. The screen according to claim 2, wherein the respective terminals are distributed on an active side of each integrated circuit in a plurality of groups (46) of at least two parallel rows (47) and the conductive tracks (23a, 23b) are divided between the groups.

5. The screen according to claim 3, wherein the tracks extending substantially at the pitch of the wires have inner ends (48) connected to the respective terminals of the integrated circuit.

* * * * *